United States Patent
Tsai et al.

(10) Patent No.: US 8,399,906 B2
(45) Date of Patent: Mar. 19, 2013

(54) ALGAINP-BASED LIGHT-EMITTING DIODE WITH DOUBLE REFLECTIVE LAYERS AND FABRICATION METHOD THEREOF

(75) Inventors: Chiahao Tsai, Xiamen (CN); Suhui Lin, Xiamen (CN); Lingfeng Yin, Xiamen (CN); Jiansen Zheng, Xiamen (CN); Kechuang Lin, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 136 days.

(21) Appl. No.: 13/099,007

(22) Filed: May 2, 2011

(65) Prior Publication Data
US 2011/0272724 A1 Nov. 10, 2011

(30) Foreign Application Priority Data
May 4, 2010 (CN) .......................... 2010 1 0170936

(51) Int. Cl.
H01L 33/28 (2010.01)
H01L 33/46 (2010.01)

(52) U.S. Cl. .................. 257/103; 257/98; 257/E33.055; 257/E33.067; 438/47

(58) Field of Classification Search .................. None
See application file for complete search history.

(56) References Cited

U.S. PATENT DOCUMENTS

| | | | | |
|---|---|---|---|---|
| 5,568,499 A * | 10/1996 | Lear | | 372/45.01 |
| 5,917,201 A * | 6/1999 | Ming-Jiunn et al. | | 257/94 |
| 6,563,141 B1 * | 5/2003 | Dawson et al. | | 257/98 |
| 6,657,236 B1 * | 12/2003 | Thibeault et al. | | 257/98 |
| 6,809,341 B2 * | 10/2004 | Hsu et al. | | 257/79 |
| 8,247,837 B2 * | 8/2012 | Lin et al. | | 257/100 |
| 2003/0164503 A1 * | 9/2003 | Chen | | 257/79 |
| 2005/0205886 A1 * | 9/2005 | Murofushi et al. | | 257/98 |
| 2006/0033113 A1 * | 2/2006 | Lee et al. | | 257/80 |
| 2008/0064133 A1 * | 3/2008 | Lee et al. | | 438/29 |
| 2008/0157108 A1 * | 7/2008 | Yu et al. | | 257/98 |
| 2008/0191233 A1 * | 8/2008 | Yang et al. | | 257/98 |
| 2009/0032830 A1 * | 2/2009 | Li | | 257/98 |

(Continued)

FOREIGN PATENT DOCUMENTS

| | | |
|---|---|---|
| CN | 1373522 A | 10/2002 |
| CN | 1897316 A | 1/2007 |

(Continued)

Primary Examiner — Thomas L Dickey
Assistant Examiner — Joseph Schoenholtz
(74) Attorney, Agent, or Firm — Fulbright & Jaworski L.L.P.

(57) ABSTRACT

The invention discloses an AlGaInP-based LED with double reflective layers and a fabrication method thereof. The method includes: providing a temporary substrate; forming an epitaxial layer on a front of the temporary substrate; forming a distributed Bragg reflector on the epitaxial layer; forming an some openings in the distributed Bragg reflector, such that the arrangement of the distributed Bragg reflector is grid-like and a portion of a top of the epitaxial layer is exposed; forming a reflective metal layer on the distributed Bragg reflector and on the exposed portion of the top of the epitaxial layer, to fill the openings; bonding a permanent substrate onto the reflective metal layer; removing the temporary substrate; forming a first electrode and a second electrode at a bottom of the epitaxial layer and a top of the permanent substrate, respectively; and dicing to obtain the AlGaInP-based LED chips. The AlGaInP-based LED with both the distributed Bragg reflector and the reflective metal layer according to the invention can fully utilize good reflectivity of the reflective layers to the extreme, and improve the light-emission efficiency of the AlGaInP-based LED effectively.

18 Claims, 3 Drawing Sheets

U.S. PATENT DOCUMENTS

| | | | |
|---|---|---|---|
| 2009/0230381 A1* | 9/2009 | Krames et al. | 257/13 |
| 2009/0294787 A1* | 12/2009 | Nakaji et al. | 257/98 |
| 2010/0012962 A1* | 1/2010 | Hong et al. | 257/98 |
| 2010/0084670 A1* | 4/2010 | Cheng et al. | 257/98 |
| 2010/0123118 A1* | 5/2010 | Hu et al. | 257/13 |
| 2010/0140635 A1* | 6/2010 | Ibbetson et al. | 257/98 |
| 2010/0140637 A1* | 6/2010 | Donofrio et al. | 257/98 |
| 2011/0049549 A1* | 3/2011 | Kim et al. | 257/98 |

FOREIGN PATENT DOCUMENTS

| | | |
|---|---|---|
| CN | 101315959 A | 12/2008 |
| KR | 20080061693 | 7/2008 |

* cited by examiner

ALGAINP-BASED LIGHT-EMITTING DIODE WITH DOUBLE REFLECTIVE LAYERS AND FABRICATION METHOD THEREOF

This application claims the benefit of Chinese patent application No. 201010170936.0, titled "AlGaInP-based Light-Emitting Diode with Double Reflective Layers and Fabrication Method thereof", filed on May 4, 2010 with State Intellectual Property Office, which is hereby incorporated by reference herein in its entirety.

FIELD OF THE INVENTION

The present invention relates to a quaternary light-emitting diode (LED), and in particular to an AlGaInP-based LED with double reflective layers and a fabrication method thereof.

BACKGROUND OF THE INVENTION

An LED is a semiconductor diode, converting electrical energy into light energy, and emitting visible (e.g. yellow, green and blue), infrared or ultraviolet light. Compared with incandescent light bulbs and neon lamps, LEDs have the advantages including lower working voltage and current, higher reliability, longer lifetime and greater intensity flexibility.

The first LED using liquid-phase epitaxy was a red LED. Since Metal Organic Chemical Vapor Deposition (MOCVD) was invented, aluminium gallium indium phosphide (AlGaInP) has been widely used to make high-power high-intensity red and yellow LEDs. Although AlGaInP-based red LEDs are commercially available, their light-emission efficiency is low, because the gallium arsenide (GaAs) substrate absorbs red light and the angle of emergence is small due to the refractive index of the semiconductor material. Therefore, with the commercial manufacturing, studies are still being conducted to improve the light-emission efficiency of AlGaInP red LEDs.

Nowadays, major techniques for improving the light-emission efficiency of red LEDs include: thickening the gallium phosphide (GaP) window layer, growing a distributed Bragg reflector (DBR) before the red light-absorbing GaAs substrate, replacing the red light-absorbing GaAs substrate with a red light-transparent GaP layer, and using flip-chip structure with a reflective metal layer.

Chinese patent application CN1373522A discloses an LED with a substrate coated with a reflective metal film and a fabrication method thereof. The LED has a permanent substrate that has a reflective metal surface. The method includes forming an LED assembly on a temporary substrate, adhering the LED assembly to a substrate with a reflective layer (i.e., the permanent substrate), and then removing the temporary substrate that absorbs light, so that light emitted by the LED assembly is no longer absorbed by the substrate and light towards the substrate is now reflected from the surface, resulting in higher intensity. However, the reflection of light by the metal in the invention is limited, normally less than 90%. Moreover, in the single reflective metal layer structure, the metal comes into direct contact with the semiconductor, which may form an alloy at a certain temperature as a result of diffusion and lead to significant drop in the reflective index of the metal layer.

Chinese patent application CN1897316A discloses a high-intensity LED structure with a reflective layer, which includes: a substrate, and a metal layer, an unalloy ohmic contact layer and a light-emitting structure which are formed on the substrate in that order. The metal layer is used as a reflective layer, and is made of pure metals or a metal nitride, to obtain good reflectivity. The unalloy ohmic contact layer is arranged between the metal layer and the light-emitting structure, providing a desired ohmic contact. To keep the metal layer clear from the unalloy ohmic contact layer, and to maintain flatness of the reflective surface of the first metal layer, an optional dielectric layer is arranged between the metal layer and the unalloy ohmic contact layer. However, forming of the unalloy ohmic contact layer is difficult to control, and the metal layer, the dielectric layer and the non-ally ohmic contact layer are all required to fully utilize the good reflectivity of the metal layer.

SUMMARY OF THE INVENTION

To solve the problems of the LEDs above, the present invention provides an AlGaInP-based LED with double reflective layers and a fabrication method thereof, more specifically, an AlGaInP-based LED with both a distributed Bragg reflector and a reflective metal layer and a fabrication method thereof.

The technical solution provided by the present invention is described below. An AlGaInP-based LED with double reflective layers, includes: an epitaxial layer; a distributed Bragg reflector formed on a top of the epitaxial layer, wherein the arrangement of the distributed Bragg reflector is grid-like with a portion of the top of the epitaxial layer exposed; a reflective metal layer formed on the distributed Bragg reflector and on the exposed portion of the top of the epitaxial layer; a permanent substrate formed on the reflective metal layer; a first electrode formed on a bottom of the epitaxial layer; and a second electrode formed on the permanent substrate.

A method for fabricating an AlGaInP-based LED with double reflective layers, includes the following steps:
1) providing a temporary substrate;
2) forming an epitaxial layer on the temporary substrate;
3) forming a distributed Bragg reflector on the epitaxial layer;
4) forming a plurality of openings in the distributed Bragg reflector, such that the arrangement of the distributed Bragg reflector is grid-like and a top of the epitaxial layer is partially exposed;
5) forming a reflective metal layer on the distributed Bragg reflector and on the exposed portion of the top of the epitaxial layer;
6) bonding a permanent substrate with the reflective metal layer;
7) removing the temporary substrate;
8) forming a first electrode and a second electrode at a bottom of the epitaxial layer and a top of the permanent substrate, respectively; and
9) dicing to obtain AlGaInP-based LED chips.

The temporary substrate may be a GaAs substrate. The material for the permanent substrate may be any one or a combination of: Si, GaP, SiC, Cu, Ni, Mo, and AlN. The distributed Bragg reflector may be formed by layers of alternating materials with a high refractive index and a low refractive index. The material with the high refractive index in the distributed Bragg reflector may be any one or a combination of: TiO, $TiO_2$, $Ti_3O_5$, $Ti_2O_3$, $Ta_2O_5$, and $ZrO_2$. The material with the low refractive index in the distributed Bragg reflector may be any one or a combination of: $SiN_x$ and $SiO_2$. The grid-like arranged distributed Bragg reflector has rectangular patterns, round patterns, or polygon patterns. The material of the reflective metal layer may be any one or a combination of:

Au, Be/Au, Au/Zn, and Pd. The permanent substrate may be bonded with the reflective metal layer by wafer bonding or electroplating.

The present invention may bring the advantages that: the distributed Bragg reflector reflects up to 99% of the light that enters the LED at right angles, and works poorly on light that enters obliquely, therefore, by using the distributed Bragg reflector and the reflective metal layer, light can be fully reflected and absorption of the light by the reflective metal layer can be avoided, which utilizes good reflectivity of the double reflective layers to the extreme and improves the light-emission efficiency of the LED; and, the reflective metal layer arranged on the distributed Bragg reflector and on the exposed portion of the top of the epitaxial layer may also be used as an ohmic contact metal, thereby simplifying the structure of the LED.

In the figures: 1. temporary substrate; 2. epitaxial layer; 3. distributed Bragg reflector; 31. etched distributed Bragg reflector; 32. openings; 4. reflective metal layer; 5. permanent substrate; 6. first electrode; and 7. second electrode.

DETAILED DESCRIPTION OF THE INVENTION

The invention will be further described hereinafter with reference to the drawings and the embodiments.

Figure 1:
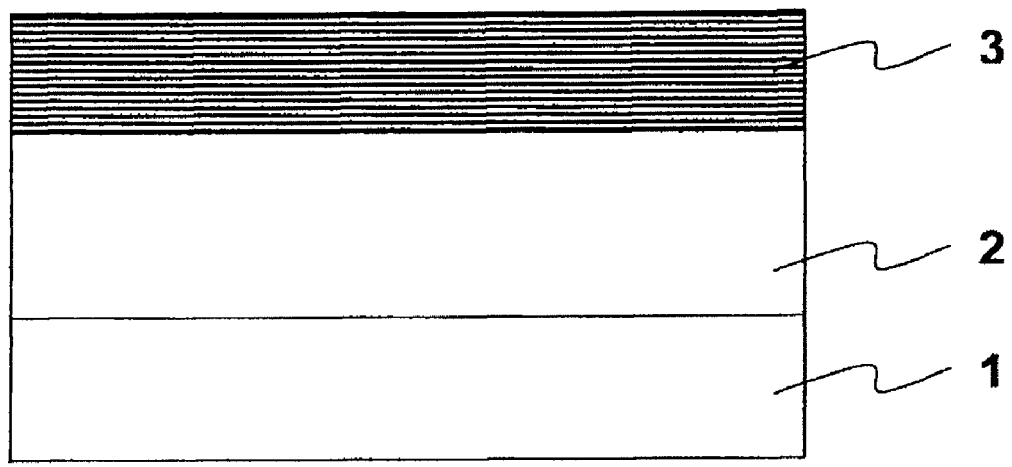
FIG. 1-FIG. 6 are sectional views of a fabrication process of an AlGaInP-based LED chip according to the present invention.

A fabrication process of an AlGaInP-based LED with double reflective layers, includes the following steps:

As shown in FIG. 1, providing a GaAs temporary substrate 1, for subsequent growth of an epitaxial layer; growing the epitaxial layer 2 on the GaAs temporary substrate 2; and depositing a distributed Bragg reflector 3 on the epitaxial layer 2.

Figure 2:
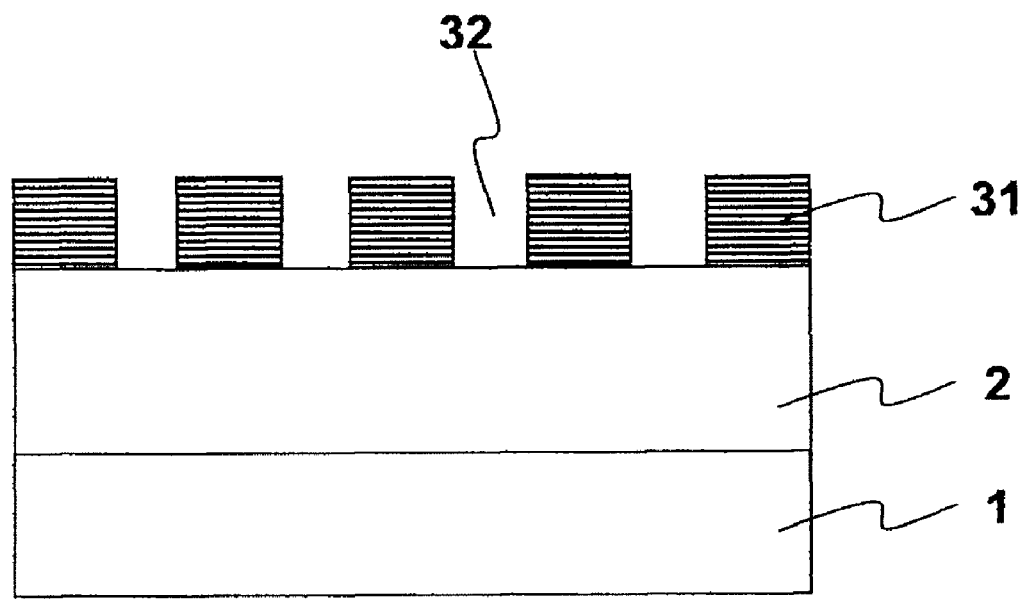

As shown in FIG. 2, forming some openings 32 in the distributed Bragg reflector 3 by using masks and etching, such that the etched distributed Bragg reflector 31 is grid-like arranged and has rectangular patterns, and a top of the epitaxial layer 2 is partially exposed. The distributed Bragg reflector 31 is formed by layers of alternating $TiO_2$ with a high refractive index and $SiO_2$ with a low refractive index.

Figure 3:
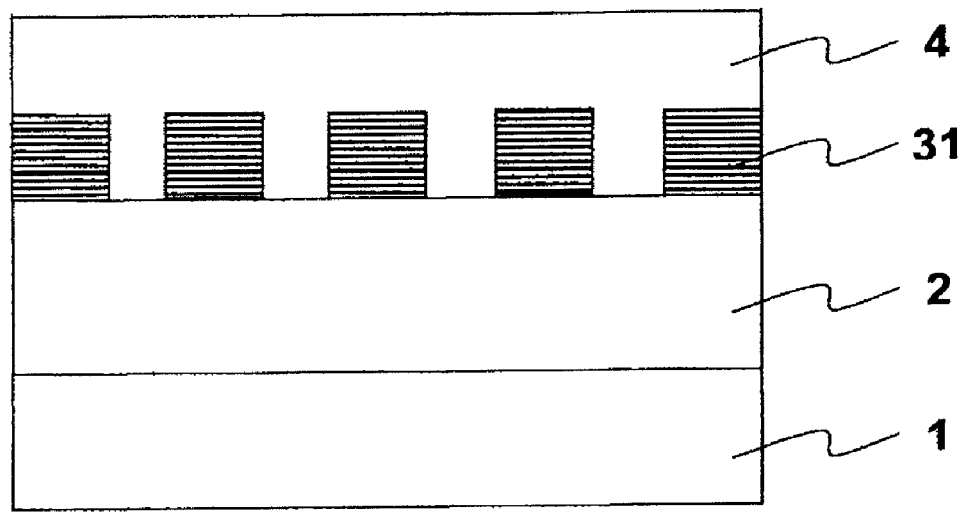

As shown in FIG. 3, forming a Be/Au reflective metal layer on the etched distributed Bragg reflector 31 and on the exposed portion of the top of the epitaxial layer 2, which fills up the openings 32.

Figure 4:
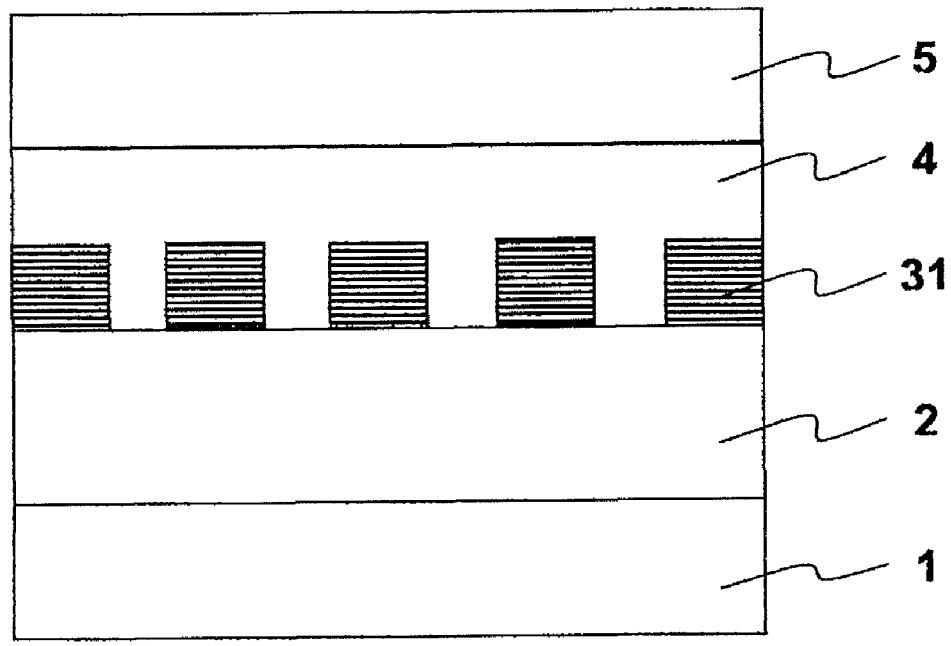

As shown in FIG. 4, bonding a Si permanent substrate 5 onto the Be/Au reflective metal layer 4 by wafer bonding.

Figure 5:
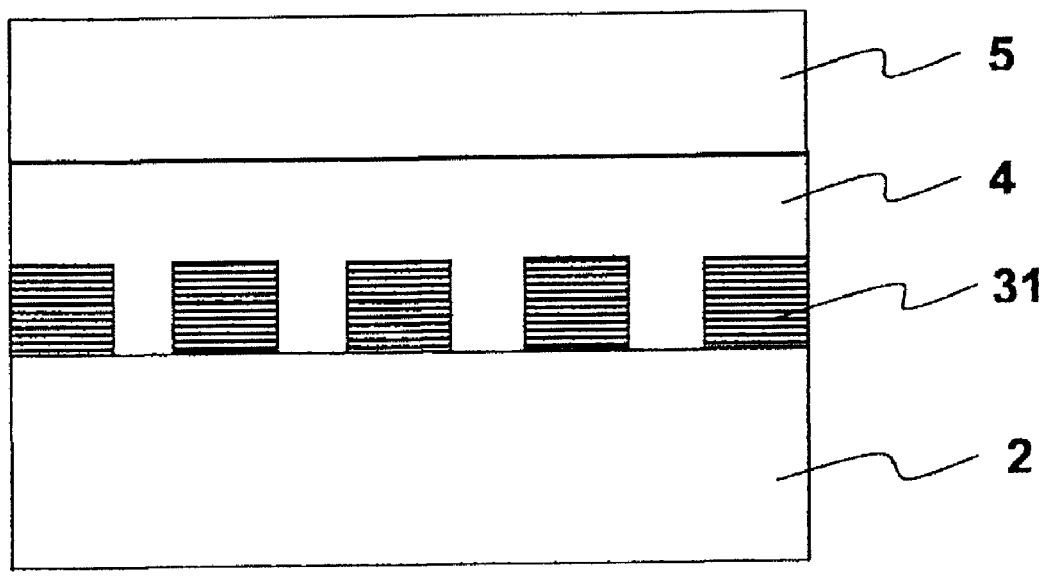

As shown in FIG. 5, removing the GaAs temporary substrate 1.

Figure 6:
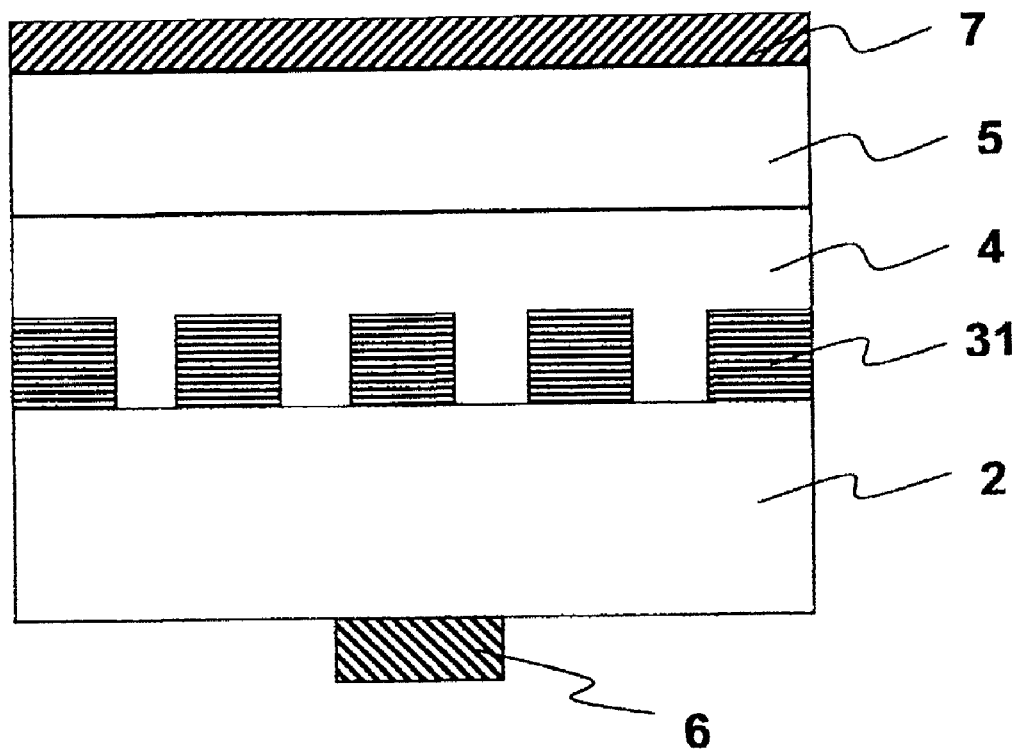

As shown in FIG. 6, forming a first electrode 6 and a second electrode 7 at a bottom of the epitaxial layer 2 and a top of the Si permanent substrate 5 respectively; and dicing is performed to obtain AlGaInP-based LED chips.

As shown in FIG. 6, the AlGaInP-based LED fabricated according to the process above includes, from the bottom to the top: the first electrode 6 in the bottom; the epitaxial layer 2 arranged on the first electrode 6; a etched distributed Bragg reflector 31 formed on the epitaxial layer 2 and grid-like arranged, with the etched distributed Bragg reflector 31 being formed by layers of alternating $TiO_2$ with a high refractive index and $SiO_2$ with a low refractive index; the Be/Au reflective metal layer 4 formed on the etched distributed Bragg reflector 31 and on the exposed portion of the top of the epitaxial layer 2; the Si permanent substrate 5 formed on the Be/Au reflective metal layer 4, and a second electrode 7 formed on the Si permanent substrate 5.

The distributed Bragg reflector reflects more than 95% of the light that enters at right angles, and the reflective metal layer further reflects light that travels through, so that the whole reflective ratio can be higher than 99%, which improves the intensity of the AlGaInP-based LED by 20%.

Embodiments above are for descriptive purpose only, and should not be considered limiting the invention. Various alternations and modifications can be made by those skilled in the art without derivation from the scope of the invention. Therefore all the equivalents should be included in the scope of the invention that is defined by the claims attached hereto.

The invention claimed is:

1. An AlGaInP-based light-emitting diode (LED) with double reflective layers, comprising:
    an epitaxial layer;
    a distributed Bragg reflector formed on a top of the epitaxial layer, wherein the arrangement of the distributed Bragg reflector is grid-like with a portion of the top of the epitaxial layer exposed;
    a reflective metal layer formed on the distributed Bragg reflector and on the exposed portion of the top of the epitaxial layer;
    a permanent substrate formed on the reflective metal layer;
    a first electrode formed on a bottom of the epitaxial layer; and
    a second electrode formed on the permanent substrate.

2. The AlGaInP-based LED with double reflective layers according to claim 1, wherein: the temporary substrate is a GaAs substrate.

3. The AlGaInP-based LED with double reflective layers according to claim 1, wherein the material for the permanent substrate is any one or a combination of: Si, GaP, SiC, Cu, Ni, Mo, and AlN.

4. The AlGaInP-based LED with double reflective layers according to claim 1, wherein: the distributed Bragg reflector is formed by layers of alternating materials with a high refractive index and a low refractive index.

5. The AlGaInP-based LED with double reflective layers according to claim 4, wherein: the material with the high refractive index in the distributed Bragg reflector is any one or a combination of: TiO, $TiO_2$, $Ti_3O_5$, $Ti_2O_3$, $Ta_2O_5$, and $ZrO_2$.

6. The AlGaInP-based LED with double reflective layers according to claim 4, wherein: the material with the low refractive index in the distributed Bragg reflector is SiNx, $SiO_2$, or a combination of SiNx and $SiO_2$.

7. The AlGaInP-based LED with double reflective layers according to claim 1, wherein: the grid-like arranged distributed Bragg reflector has rectangular patterns, round patterns, or polygon patterns.

8. The AlGaInP-based LED with double reflective layers according to claim 1, wherein: the material of the reflective metal layer is any one or a combination of: Au, Be/Au, Au/Zn, and Pd.

9. The AlGaInP-based LED with double reflective layers according to claim 1, wherein: the permanent substrate is bonded with the reflective metal layer by wafer bonding or electroplating.

10. A method for fabricating an AlGaInP-based light-emitting diode (LED) with double reflective layers, comprising:
    1) providing a temporary substrate;
    2) forming an epitaxial layer on the temporary substrate;
    3) forming a distributed Bragg reflector on the epitaxial layer;

4) forming a plurality of openings in the distributed Bragg reflector, such that the arrangement of the distributed Bragg reflector is grid-like and a top of the epitaxial layer is partially exposed;
5) forming a reflective metal layer on the distributed Bragg reflector and on the exposed portion of the top of the epitaxial layer;
6) bonding a permanent substrate with the reflective metal layer;
7) removing the temporary substrate;
8) forming a first electrode and a second electrode at a bottom of the epitaxial layer and a top of the permanent substrate, respectively; and
9) dicing to obtain AlGaInP-based LED chips.

11. The method for fabricating an AlGaInP-based LED with double reflective layers according to claim 10, wherein: the temporary substrate is a GaAs substrate.

12. The method for fabricating an AlGaInP-based LED with double reflective layers according to claim 10, wherein the material for the permanent substrate is any one or a combination of: Si, GaP, SiC, Cu, Ni, Mo, and AlN.

13. The method for fabricating an AlGaInP-based LED with double reflective layers according to claim 10, wherein: the distributed Bragg reflector is formed by layers of alternating materials with a high refractive index and a low refractive index.

14. The method for fabricating an AlGaInP-based LED with double reflective layers according to claim 13, wherein the material with the high refractive index in the distributed Bragg reflector is any one or a combination of: TiO, $TiO_2$, $Ti_3O_5$, $Ti_2O_3$, $Ta_2O_5$, and $ZrO_2$.

15. The method for fabricating an AlGaInP-based LED with double reflective layers according to claim 13, wherein the material with the low refractive index in the distributed Bragg reflector is $SiN_x$, $SiO_2$, or a combination of $SiN_x$ and $SiO_2$.

16. The method for fabricating an AlGaInP-based LED with double reflective layers according to claim 10, wherein the grid-like arranged distributed Bragg reflector has rectangular patterns, round patterns, or polygon patterns.

17. The method for fabricating an AlGaInP-based LED with double reflective layers according to claim 10, wherein the material of the reflective metal layer is any one or a combination of: Au, Be/Au, Au/Zn, and Pd.

18. The method for fabricating an AlGaInP-based LED with double reflective layers according to claim 10, wherein the permanent substrate is bonded with the reflective metal layer by wafer bonding or electroplating.

* * * * *